(12) United States Patent
Chang et al.

(10) Patent No.: US 11,742,240 B2
(45) Date of Patent: Aug. 29, 2023

(54) SOURCE/DRAIN CONTACT FORMATION METHODS AND DEVICES

(71) Applicant: Taiwan Semiconductor Manufacturing Co., Ltd., Hsinchu (TW)

(72) Inventors: Cheng-Wei Chang, Hsinchu (TW); Yu-Ming Huang, Tainan (TW); Ethan Tseng, Hsinchu (TW); Ken-Yu Chang, Hsinchu (TW); Yi-Ying Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/676,638

(22) Filed: Feb. 21, 2022

(65) Prior Publication Data

US 2022/0189825 A1   Jun. 16, 2022

Related U.S. Application Data

(62) Division of application No. 15/931,111, filed on May 13, 2020, now Pat. No. 11,257,712.

(51) Int. Cl.
*H01L 21/768* (2006.01)
*H01L 21/02* (2006.01)
(Continued)

(52) U.S. Cl.
CPC .. *H01L 21/76856* (2013.01); *H01L 21/02068* (2013.01); *H01L 21/28518* (2013.01);
(Continued)

(58) Field of Classification Search
CPC ......... H01L 21/76856; H01L 21/02068; H01L 21/28518; H01L 21/76805; H01L 21/76843; H01L 21/76895; H01L 29/045; H01L 29/0847; H01L 29/161; H01L 29/41791; H01L 29/45; H01L 29/66795; H01L 29/7851
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| KR | 20030029455 A | 4/2003 |
| KR | 20120099863 A | 9/2012 |

(Continued)

*Primary Examiner* — Shahed Ahmed
*Assistant Examiner* — Vicki B. Booker
(74) *Attorney, Agent, or Firm* — Haynes and Boone, LLP

(57) ABSTRACT

A semiconductor device includes a substrate, two semiconductor fins protruding from the substrate, an epitaxial feature over the two semiconductor fins and connected to the two semiconductor fins, a silicide layer over the epitaxial feature, a barrier layer over the silicide layer, and a metal layer over the barrier layer. The barrier layer includes a metal nitride. Along a boundary between the barrier layer and the metal layer, an atomic ratio of oxygen to metal nitride is about 0.15 to about 1.0.

20 Claims, 13 Drawing Sheets

(51) Int. Cl.

| | |
|---|---|
| *H01L 21/285* | (2006.01) |
| *H01L 29/04* | (2006.01) |
| *H01L 29/08* | (2006.01) |
| *H01L 29/161* | (2006.01) |
| *H01L 29/417* | (2006.01) |
| *H01L 29/45* | (2006.01) |
| *H01L 29/66* | (2006.01) |
| *H01L 29/78* | (2006.01) |

(52) U.S. Cl.
CPC .. *H01L 21/76805* (2013.01); *H01L 21/76843* (2013.01); *H01L 21/76895* (2013.01); *H01L 29/045* (2013.01); *H01L 29/0847* (2013.01); *H01L 29/161* (2013.01); *H01L 29/41791* (2013.01); *H01L 29/45* (2013.01); *H01L 29/66795* (2013.01); *H01L 29/7851* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 10,490,459 B2 | 11/2019 | Koh et al. | |
| 2003/0068887 A1 | 4/2003 | Shingubara et al. | |
| 2012/0223364 A1 | 9/2012 | Chung et al. | |
| 2015/0031183 A1 | 1/2015 | Kang | |
| 2016/0308004 A1* | 10/2016 | Lee | H01L 29/41791 |
| 2017/0186748 A1* | 6/2017 | Lee | H01L 21/823821 |
| 2017/0243760 A1 | 8/2017 | Chao | |
| 2019/0164822 A1* | 5/2019 | Chou | H01L 29/66795 |
| 2019/0273147 A1 | 9/2019 | Cheng et al. | |
| 2020/0135553 A1 | 4/2020 | Chen et al. | |

FOREIGN PATENT DOCUMENTS

| | | |
|---|---|---|
| KR | 20200050420 A | 5/2020 |
| TW | 201937610 A | 9/2019 |
| TW | 201964121 A | 12/2019 |

\* cited by examiner

SOURCE/DRAIN CONTACT FORMATION METHODS AND DEVICES

PRIORITY

This is a divisional of U.S. application Ser. No. 15/931,111, filed May 13, 2020, issued as U.S. Pat. No. 11,257,712, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices are scaled down progressively, source/drain (S/D) contact resistance has become increasingly dominant in the conducting path of a transistor. Studies have shown that contact resistance may account for 51% or more of the total conducting path resistance. Improvements in the areas of reducing source/drain contact resistance are highly desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
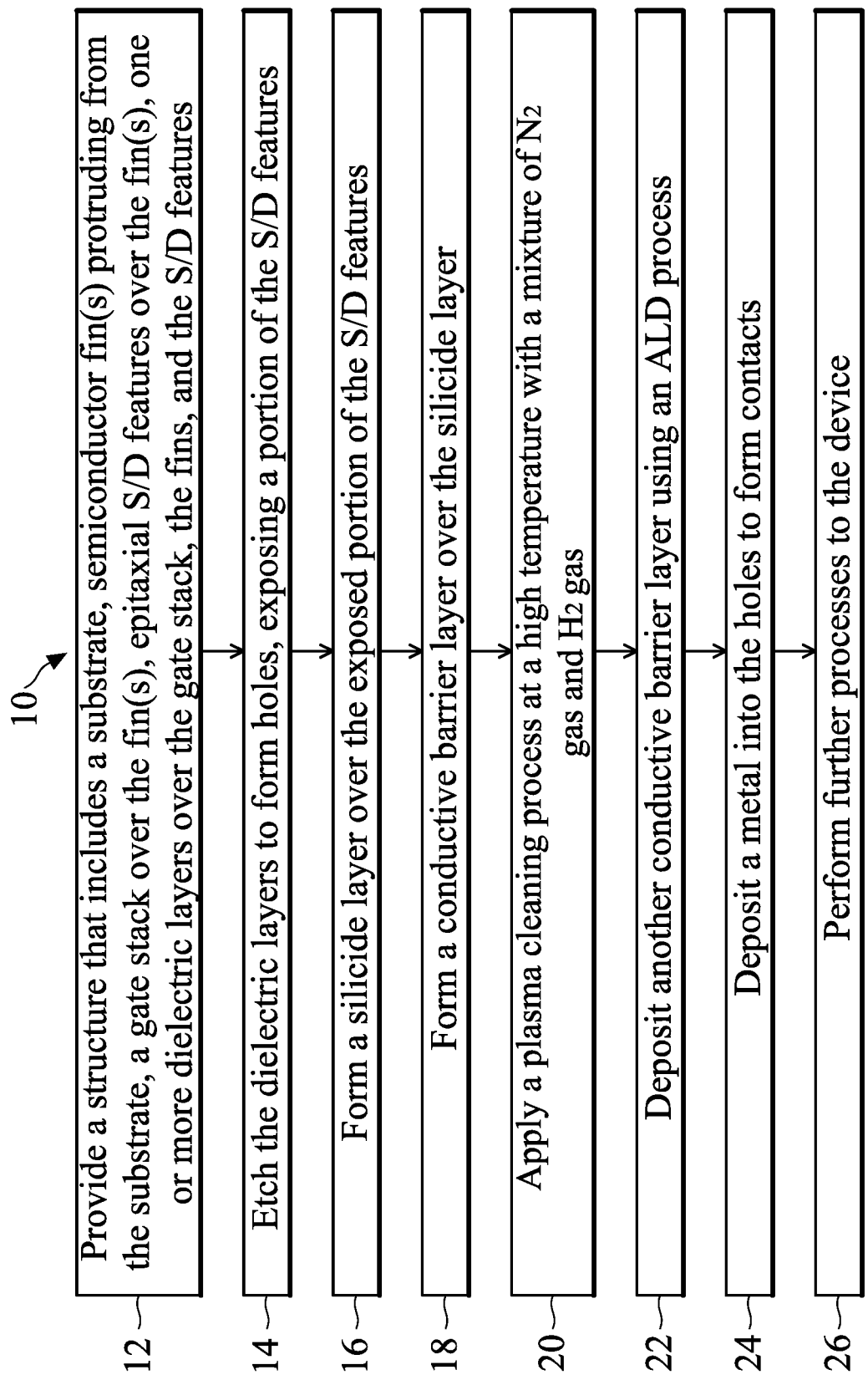
FIG. 1 shows a flow chart of a method of forming a semiconductor device with reduced source/drain contact resistance, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10%), or other number described in accordance with the knowledge of the skilled in the art in view of the specific technology disclosed herein, unless otherwise specified. For example, the term "about 5 nm" encompasses the dimension range from 4.5 nm to 5.5 nm, 4.0 nm to 5 nm, etc.

The present disclosure in various embodiments is generally related to semiconductor devices and methods of forming the same. In particular, the present disclosure is related to forming source/drain (S/D) contacts in field effect transistors (FETs) including FinFETs, nanowire FETs, nanosheet FETs, or other advanced FETs. The S/D contact may be formed over a single epitaxial feature, multiple epitaxial features merged into one continuous piece, or other semiconductor structures that serve as the S/D electrode of a transistor. The S/D contact typically includes more than one layer, such as having a silicide layer over the underlying S/D semiconductor material, one or more conductive barrier layers (e.g., conductive metal nitrides), and a highly conductive bulk metal layer (e.g., cobalt). Inventors of the present disclosure have discovered that chemical compounds containing oxygen (such as metal oxides) may be inadvertently introduced between the S/D semiconductor material and the highly conductive bulk metal layer during the fabrication of the S/D contacts. For example, when forming the silicide layer and the conductive barrier layer(s), oxygen may be present in the environment, though at a very low density. Oxygen reacts with the metals to form metal oxides. These chemical compounds lead to increased S/D contact resistance. Various embodiments of the present disclosure apply a novel plasma cleaning process to effectively remove these chemical compounds with negligible damage to the silicide layers and the conductive barrier layers. Embodiments of the present disclosure are described below with reference to the accompanying figures.

Figure 2:
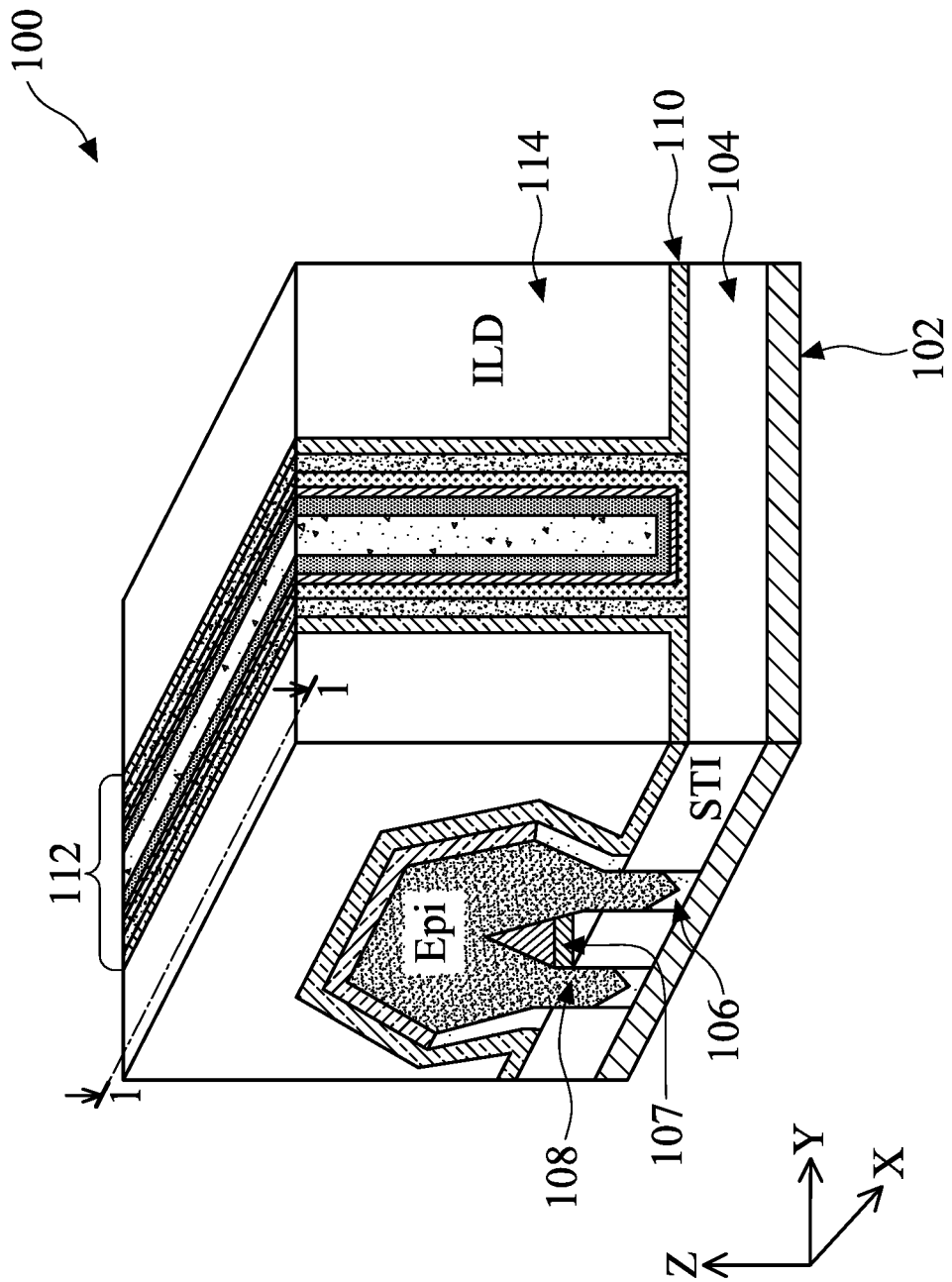
FIG. 2 illustrates a perspective view of a semiconductor device in an intermediate step of fabrication according to an embodiment of the method of FIG. 1.
Figure 9:
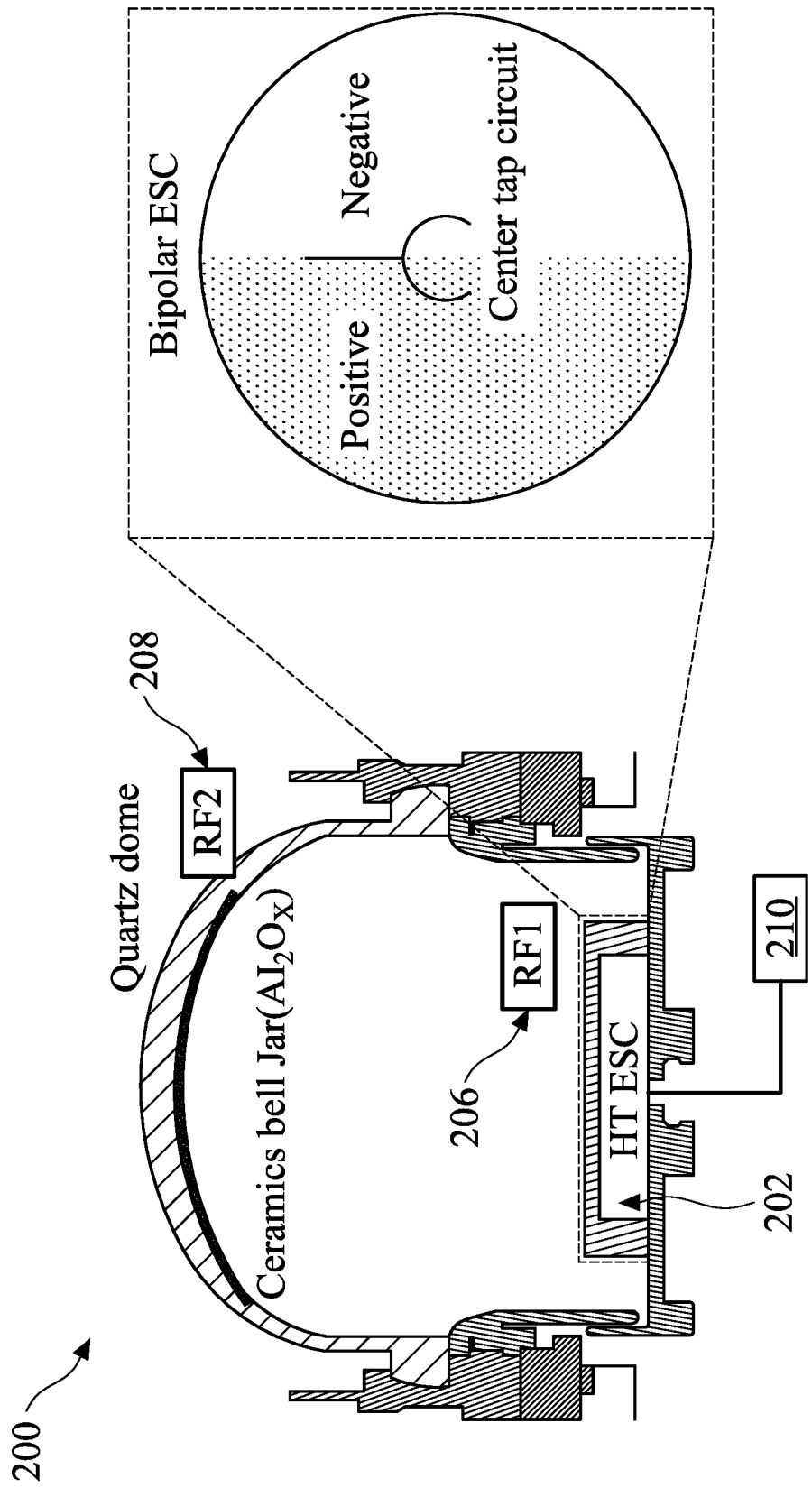
FIG. 9 illustrates a schematic view of a cleaning process chamber used in steps of the method of FIG. 1, according to the present disclosure.
Figure 10:
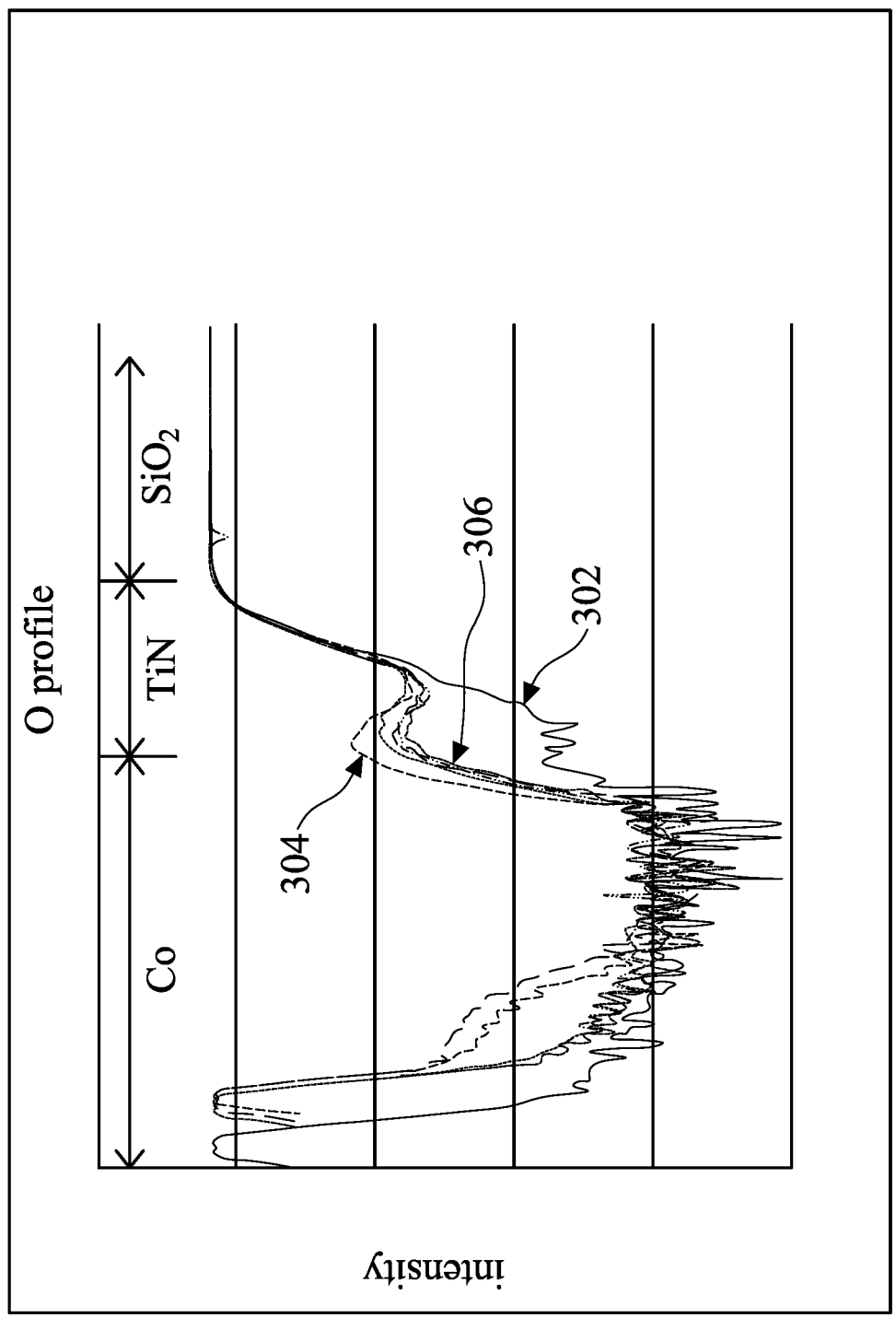
FIGS. 10, 11, and 12 illustrate the intensity of oxygen, metal nitride, and carbon at the interface between a source/drain and a contact thereon, in accordance with some embodiments of the present disclosure.
Figure 11:
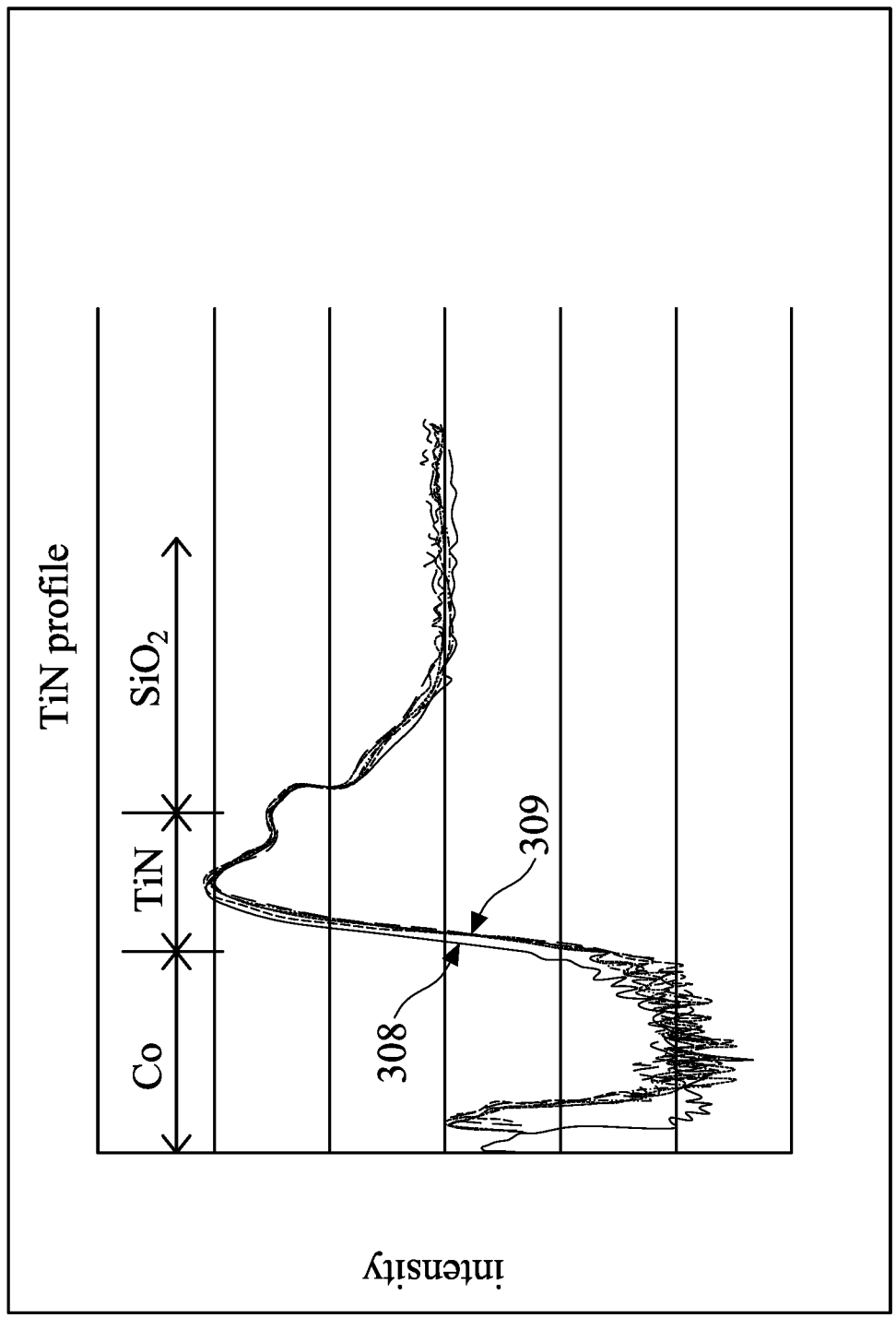
Figure 12:
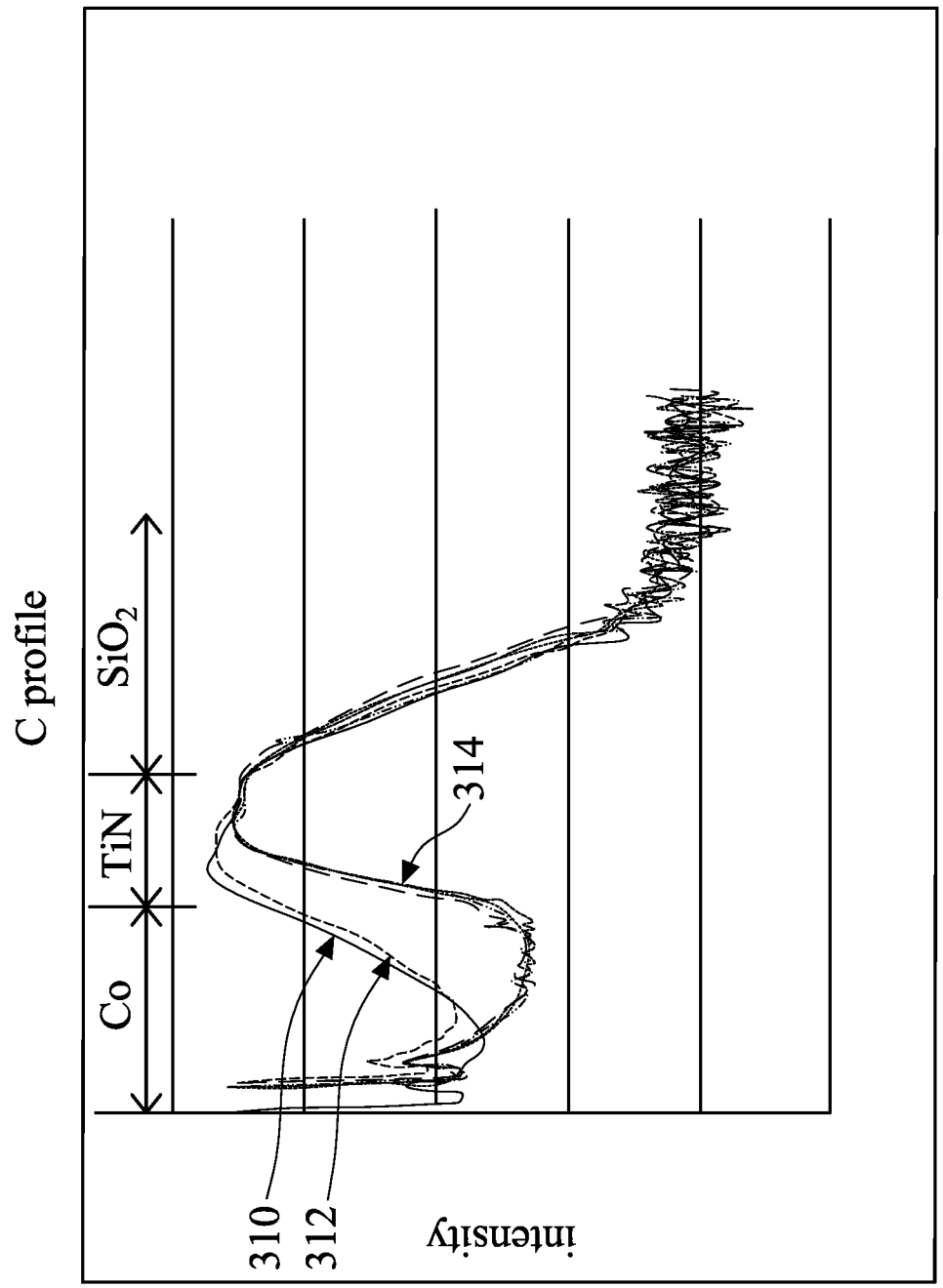

FIG. 1 shows a block diagram of a method 10 of forming a semiconductor device according to various aspects of the present disclosure. The method 10 is an example, and is not intended to limit the present disclosure beyond what is explicitly recited in the claims. Additional operations can be provided before, during, and after the method 10, and some operations described can be replaced, eliminated, or relocated for additional embodiments of the method. The method 10 is described below in conjunction with FIGS. 2-12. Particularly, FIG. 2 illustrates a perspective view of a semiconductor device 100 and FIGS. 3-8 illustrate cross-sectional views of the semiconductor device 100, at various stages of fabrication according to the method 10. FIG. 9 illustrates a schematic view of a chamber for performing a plasma cleaning process according to the present disclosure. FIGS. 10, 11, and 12 show the intensity of certain chemical elements at certain layers of the semiconductor device 100 according to some embodiments.

Referring to FIG. 1, at operation 12, the method 10 provides or is provided with a structure, which is the semiconductor device 100 at an intermediate fabrication stage, as shown in FIG. 2.

The semiconductor device 100 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (PFETs), n-type FETs (NFETs), FinFETs, nanowire FETs, nanosheet FETs, metal-oxide semiconductor field effect transistors (MOSFET), complementary metal-oxide semiconductor (CMOS) transistors, bipolar transistors, high voltage transistors, high frequency transistors, other memory cells, and combinations thereof. Furthermore, the various features including transistors, fins, gate stacks, device regions, and other features in various embodiments of the present disclosure are provided for simplification and ease of understanding and do not necessarily limit the embodiments to any types of devices, any number of devices, any number of regions, or any configuration of structures or regions. Even though illustrated as a FinFET device in various embodiments, the device 100 can also be planar FET devices and other multi-gate devices such as nanowire FETs and nanosheet FETs in alternative embodiments.

Referring to FIG. 2, in this embodiment, the device 100 includes a substrate 102, an isolation structure 104 over the substrate 102, and two or more fins 106 (two shown in FIG. 2) over the substrate 102. The fins 106 extend lengthwise along the "y" direction. Even though not shown, some portions of the fins 106 (e.g., underneath a gate structure 112) may protrude above the isolation structure 104. Further in this embodiment, the device 100 includes one or more epitaxially grown semiconductor features 108, with two shown in FIG. 2. Top portions of the epitaxial features 108 may merge into a continuous layer. The epitaxial features 108 serve as the source/drain (S/D) electrodes of the semiconductor device 100. Therefore, the epitaxial features 108 are also referred to as the S/D 108 in the present disclosure. In some embodiments, a void 107 may exist between the top surface of the isolation structure 104 and the merged portion of the epitaxial features 108. In alternative embodiments (not shown), the epitaxial features 108 may be separate from each other. The semiconductor device 100 further includes a gate structure 112 over the isolation structure 104 and engaging a channel region of the fins 106, a contact etch stop layer 110 over the isolation structure 104 and the epitaxial features 108, and an interlayer dielectric (ILD) layer 114 over the contact etch stop layer 110. Various elements of the semiconductor device 100 are further described below.

The substrate 102 is a silicon substrate in the present embodiment (e.g., including single crystalline silicon). Alternatively, the substrate 102 may comprise another semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a semiconductor layer on a dielectric layer. In embodiments, the substrate 102 includes active regions such as p-wells and n-wells for forming active devices.

The fins 106 may comprise substantially the same semiconductor material as the substrate 102. For example, they both include primarily silicon. Alternatively, the fins 106 may comprise a different semiconductor material than the substrate 102. For example, the substrate 102 may comprise primarily silicon and the fins 106 may comprise primarily silicon germanium. Although not shown in FIG. 2, each of the fins 106 includes a channel region and two S/D regions sandwiching the channel region. The channel region is under the gate structure 112, and the S/D regions (under the epitaxial features 108) are on both sides of the gate structure 112. The channel region of the fins 106 may be in the form of a fin channel for FinFET, in the form of one or more nanowires or nanosheets for nanowire FETs or nanosheet FETs respectively, or in other forms or shapes. The fins 106 may be formed using single patterning process, double patterning process, or other multi-patterning processes.

The fins 106 are separated by the isolation structure 104. The isolation structure 104 may comprise silicon oxide, silicon nitride, silicon oxynitride, fluoride-doped silicate glass (FSG), a low-k dielectric material, and/or other suitable insulating material. The isolation structure 104 may be shallow trench isolation (STI) features in some embodiments.

In an embodiment, each of the epitaxial features (S/D) 108 may include silicon doped with one or more n-type dopants, such as phosphorus (P) or arsenic (As), for forming NFET devices. In another embodiment, each of the epitaxial features 108 may include silicon germanium doped with one or more p-type dopants, such as boron (B) or indium (In), for forming PFET devices. Each of the epitaxial features 108 may include one or more layers having different dopant concentrations. For example, an upper portion of the epitaxial features 108 may comprise silicon doped with phosphorus having a dopant concentration ranging from $1\ e^{21}$ $cm^{-3}$ to $5\ e^{21}\ cm^{-3}$, while a lower portion of the epitaxial features 108 may comprise silicon doped with phosphorus having a dopant concentration ranging from $1\ e^{20}\ cm^{-3}$ to $1\ e^{20}\ cm^{-3}$. The higher concentration at the upper portion of the epitaxial features 108 enhances the conductivity of the semiconductor material.

The dielectric layer 110 may comprise a nitride such as silicon nitride, silicon oxynitride, or silicon carbon nitride. The ILD layer 114 comprises a different material than the dielectric layer 110. For example, the ILD layer 114 may comprise tetraethylorthosilicate (TEOS) oxide, doped or un-doped silicate glass such as fluoride-doped silica glass (FSG), while the dielectric layer 110 comprises a nitride.

The gate structure 112 includes a gate dielectric layer and a gate electrode layer. The gate dielectric layer may include silicon oxide ($SiO_2$) or a high-k dielectric material such as hafnium oxide, zirconium oxide, lanthanum oxide, titanium oxide, yttrium oxide, and strontium titanate. The gate dielectric layer may be formed by chemical oxidation, thermal oxidation, atomic layer deposition (ALD), chemical vapor deposition (CVD), and/or other suitable methods. In an embodiment, the gate electrode layer includes polysilicon, and may be formed by suitable deposition processes such as low-pressure chemical vapor deposition (LPCVD) and plasma-enhanced CVD (PECVD). In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes. In some embodiments, the gate structure 112 includes an interfacial layer between its gate dielectric layer and the fins 106. The interfacial layer may include a dielectric material such as silicon oxide or silicon oxynitride, and may be formed by chemical oxidation, thermal oxidation, ALD, CVD, and/or other suitable dielectric. The gate structure 112 may include other layers such as hard mask layer(s) over the gate electrode layer.

Figure 3:
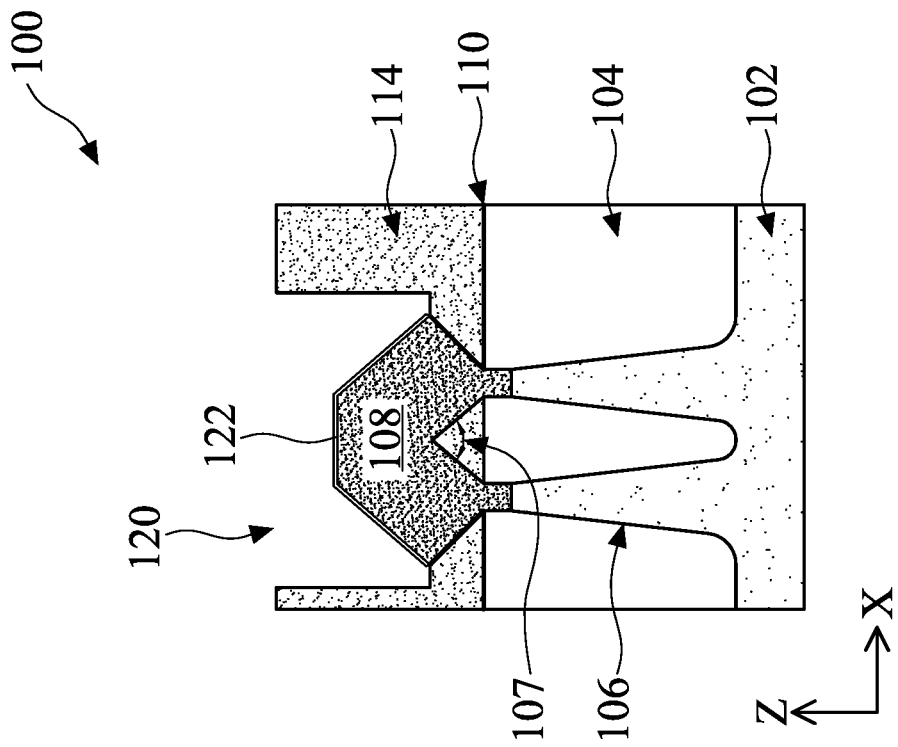
FIGS. 3, 4, 5, 6, and 7 illustrate cross sectional views of forming a semiconductor device according to the method of FIG. 1, in accordance with some embodiments.

Referring to FIG. 1, at operation 14, the method 10 etches various dielectric layers including the ILD layer 114 and the etch stop layer 110 to form one or more contact holes 120, exposing a top portion of the epitaxial features 108 as shown in FIG. 3, which shows a cross-sectional view of the semiconductor device 100 cut along the 1-1 line (in the x-z plane) in FIG. 2. The operation 14 may involve a variety of processes including deposition, photolithography, and etching. For example, the operation 14 may form an etch mask (not shown) over the semiconductor device 100. The etch mask may include silicon nitride, silicon oxide, a photoresist layer, or a combination thereof. The etch mask is patterned via photolithography to provide openings to expose various portions of the device 100. Then, the device 100 is etched through the openings to remove the exposed portions of the dielectric layers 114 and 110, for example, using a dry etching process, a wet etching process, a reactive ion etching process, or a combination thereof. In some embodiments, the operation 14 may further etch part of the epitaxial feature 108 by tuning the etchant chemistry or etching time. This is sometimes referred to as over etching, which may increase the area of the semiconductor material for contact landing, thereby reducing S/D contact resistance.

As shown in FIG. 3, the epitaxial features 108 include a merged continuous layer in this embodiment. After the operation 14, a top surface 108-T and sidewall surfaces (or side surfaces) 108-S of the merged epitaxial features 108 are exposed in the contact hole 120. In some embodiments, the contact hole 120 exposes only part of the sidewall surfaces 108-S on all sides. In some embodiments, the contact hole 120 exposes the whole sidewall surface 108-S on at least one side of the merged epitaxial features 108. In various embodiments, the contact hole 120 may expose the merged epitaxial features 108 symmetrically or asymmetrically around the top surface 108-T. In an embodiment, the top surface 108-T is in the cubic crystal {001} plane (e.g., SiGe {001} plane or Si {001} plane) and the sidewall surfaces 108-S are in the cubic crystal {111} plane (e.g., SiGe {111} plane or Si {111} plane). Inventors of the present disclosure have discovered that metal oxides (or other oxide residue) are difficult to remove from the sidewall surfaces 108-S, particularly near the bottom of the sidewall surfaces 108-S, which is one of the primary reasons for increased S/D contact resistance.

Figure 4:
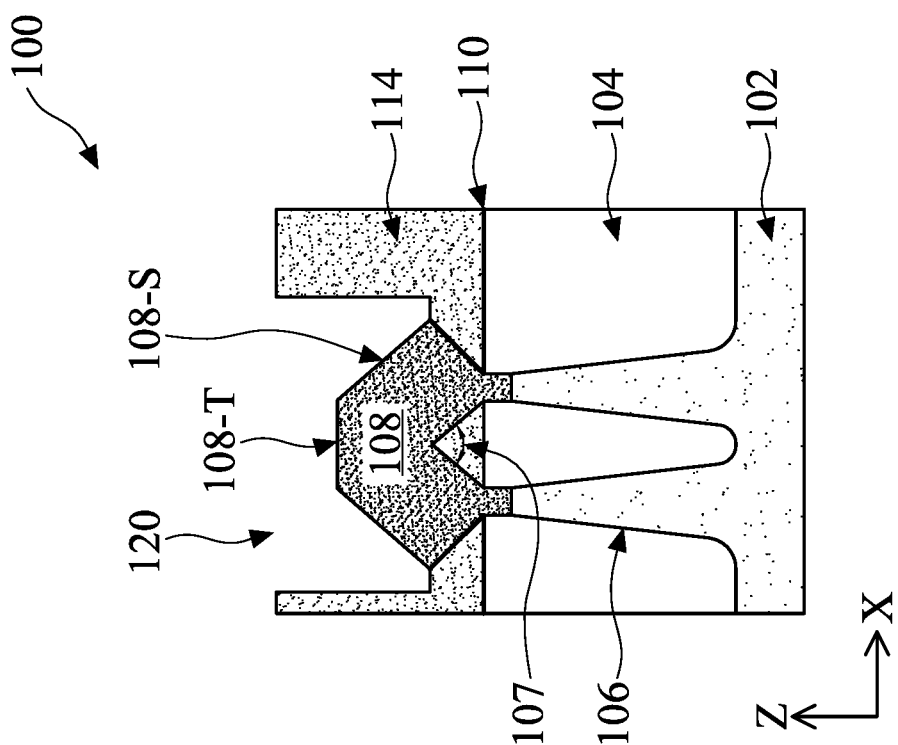

Referring to FIG. 1, at operation 16, the method 10 forms a silicide layer 122 over the exposed portion of the epitaxial features 108. An embodiment of the semiconductor device 100 as a result of the operation 16 is shown in FIG. 4. Referring to FIG. 4, the silicide layer 122 is formed on the top and the sidewall surfaces of the exposed portions of the epitaxial features 108. In an embodiment, the operation 16 includes applying a metal-containing chemical to the semiconductor device 100, where the metal-containing chemical reacts with the semiconductor material in the epitaxial features 108 to form the silicide layer 122. For example, the operation 16 may apply titanium chloride (e.g., $TiCl_4$) to react with silicon germanium to form titanium silicide or titanium germano-silicide. In another embodiment, the operation 16 includes depositing a metal layer over the exposed portions of the epitaxial features 108, annealing the metal layer such that the metal layer reacts with the semiconductor material in the epitaxial features 108 to form the silicide layer 122, and subsequently removing the non-reacted metal layer. In various embodiments, the metal element(s) in the silicide layer 122 may include titanium, cobalt, platinum, nickel, molybdenum, tantalum, tungsten, or a combination thereof. The silicide layer 122 reduces S/D contact resistance, generally in two ways. First, the low sheet resistance of the silicide layer 122 shunts the heavily doped diffusion region of the epitaxial features 108 to reduce its in-plane resistance, and second, the silicide reaction leads to intimate and more reliable metal-semiconductor contact and improves the conduction in the vertical direction.

Figure 5:
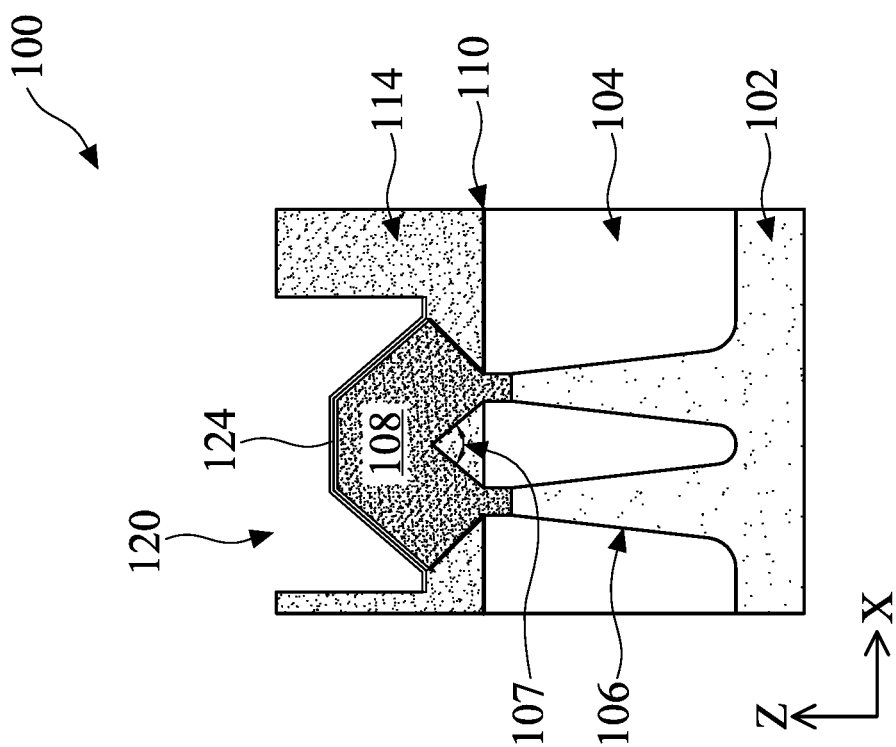

Referring to FIG. 1, at operation 18, the method 10 forms a conductive barrier layer 124 over the silicide layer 122. An embodiment of the semiconductor device 100 as a result of the operation 18 is shown in FIG. 5. Referring to FIG. 5, in this embodiment, the conductive barrier layer 124 is formed mainly on the bottom surface of the contact hole 120 and is substantially free from the sidewall surfaces of the contact hole 120. Particularly, the conductive barrier layer 124 is formed on the top and the sidewall surfaces of the epitaxial features 108 and fully covering the silicide layer 122. In an embodiment, the conductive barrier layer 124 is formed by a chemical vapor deposition (CVD) process, such as a plasma enhanced CVD process. For example, plasma generated from titanium chloride (e.g., $TiCl_4$) and nitrogen ($N_2$), ammonia ($NH_3$), or a combination of nitrogen ($N_2$) and ammonia (NH$_3$) may be used to deposit a layer of titanium nitride as the conductive barrier layer 124. In another embodiment, the conductive barrier layer 124 may include tantalum nitride or other conductive nitrides. The conductive barrier layer 124 functions to prevent metal elements in a subsequently deposited bulk contact metal from diffusing into the silicide layer 122 and the epitaxial features 108.

Inventors of the present disclosure have discovered that oxides such as metal oxides may be inadvertently deposited in the contact hole 120 during the formation of the silicide layer 122 and/or the conductive barrier layer 124. For example, a compound containing Ti, Si, O, and N may be formed over or in the barrier layer 124 or throughout the layers 122 and 124. These oxides adversely increase the S/D contact resistance.

Referring to FIG. 1, at operation 20, the method 10 applies a plasma cleaning process to the semiconductor device 100, particularly to the structures inside the contact hole 120, to remove the oxides from the layers 122 and 124. In an embodiment, the plasma cleaning process applies a gas mixture including N$_2$ gas and H$_2$ gas at certain ratio of flow rates so that the oxides are effectively removed while the silicide layer 122 and the conductive barrier layer 124 are not adversely affected. Further, the plasma cleaning process is performed at a temperature sufficiently high so that the plasma can react with the oxides effectively and the byproducts of the reaction can be effectively exhausted from the process chamber while various elements of the semiconductor device 100 are not adversely impacted. In a non-limiting example where the target oxides include TiSiON, the following reaction may happen during the plasma cleaning process:

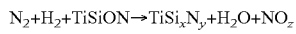

$$N_2 + H_2 + TiSiON \rightarrow TiSi_xN_y + H_2O + NO_z$$

In an embodiment, a ratio of a flow rate of the N$_2$ gas to a flow rate of the H$_2$ gas during a whole or a part of the plasma cleaning process is controlled to be in a range of 0.03 to 0.28, such as in a range of 0.22 to 0.26. This range of ratio of flow rates has found to achieve the primary goal of the plasma cleaning process—effectively removing oxide compounds and reducing S/D contact resistance. If the ratio of the flow rates is below 0.03, there may not be enough nitrogen in the plasma to substitute oxygen in the target oxide compounds. As a result, the plasma cleaning process may not be very effective in removing the oxide compounds. On the other hand, if the ratio of the flow rates is above 0.28, the metal elements in the silicide layer 122 and/or the conductive barrier layer 124 might react with nitrogen to result in a thick layer of nitrogen (or nitride) compounds disposed between the epitaxial features 108 and the later-deposited bulk metal contact. Having such a thick layer of nitrogen compounds would adversely increase the S/D contact resistance. For a similar reason as stated above, the flow rate of the N$_2$ gas is controlled to be 10 standard cubic centimeters per minute (sccm) or lower in various embodiments of the present disclosure so that the plasma cleaning process does not produce a thick layer of nitrogen compounds. In an embodiment, a flow rate of the N$_2$ gas is controlled to be about 1 to 9 standard cubic centimeters per minute (sccm) and a flow rate of the H$_2$ gas is controlled to be about 30 sccm during the plasma cleaning process.

Further, in various embodiments, the plasma cleaning process is performed while the semiconductor structure 100 is held at a temperature (process temperature) of at least 300° C. For example, the process temperature may be in a range from 300° C. to 500° C., in a range from 300° C. to 400° C., in a range from 380° C. to 400° C., or at about 400° C. (e.g., within +/−10% of 400° C.). If the process temperature is lower than this range (e.g., below 300° C.), the chemical reaction discussed above may be so slow (or not happening) that the removal of the oxide compounds would not be effective. Particularly, oxide compounds near the lower portion of the sidewall surfaces 108-S of the epitaxial features 108 (see FIG. 3) are difficult to remove if the process temperature is low. Another benefit of having a high temperature within the disclosed range is that the byproducts of the chemical reaction (such as H$_2$O and NO$_z$) can be effectively vaporized and exhausted from the process chamber. On the other hand, if the process temperature is higher than this range (e.g., above 500° C.), some metal elements in the semiconductor device 100 (such as metal layers in the gate structure 112) may be adversely impacted. In various embodiment, the operation 20 removes oxide compounds from the layers 122 and 124 such that the level of oxygen in the layers 122 and 124 becomes undetectable.

In an embodiment, the operation 20 is performed in a process chamber 200, a schematic view of which is shown in FIG. 9. Referring to FIG. 9, the process chamber 200 includes a quartz dome enclosing a ceramic bell jar. A high temperature electrostatic chuck (e-chuck) 202 is placed inside the ceramic bell jar. In the present embodiment, the e-chuck 202 is a bipolar electrostatic chuck, providing a quick clamping and de-clamping of a wafer (e.g., a wafer having the semiconductor device 100). Further, the e-chuck 202 provides a heating function with a tunable temperature. For example, the e-chuck 202 can be configured to heat and maintain the wafer thereon to a desired temperature or temperature range. In the present embodiment, the e-chuck 202 is configured to heat and maintain the wafer thereon to a temperature in a range from 300° C. to 500° C., in a range from 300° C. to 400° C., in a range from 380° C. to 400° C., or at about 400° C. during the operation 20. In an embodiment, a carrier gas is supplied to the bottom side of the e-chuck 202 (the wafer is held on a top side opposite to the bottom side) so that heating can be uniform across the whole wafer. For example, this carrier gas can be supplied at a flow rate of 2 sccm to 20 sccm. In an embodiment, the e-chuck 202 is provided with a tunable chucking voltage in a range of 275 V to 350 V.

The process chamber 200 further includes two radio frequency (RF) power sources, RF1 206 and RF2 208. In an embodiment, the RF2 208 is configured to supply power with a frequency in a range of 1 MHz to 5 MHz, such as 2 MHz, for generating plasma from a gas mixture having N$_2$ gas and H$_2$ gas. The RF1 206 is configured to supply power with a frequency in a range of 10 MHz to 20 MHz, such as 13.56 MHz, for directing plasma onto the surface of the wafer held on the e-chuck 202. Further, the RF1 206 may supply a power of 50 W to 85 W, such as about 75 W, during the operation 20. The RF2 208 may supply a power of 850 W to 950 W during the operation 20. During the operation 20, the process chamber 200 is supplied with a gas mixture having N$_2$ gas and H$_2$ gas with a ratio of the respective flow rates as discussed above. Further, the pressure inside the process chamber 200 may be maintained in a range of 1 mTorr to 20 mTorr. The various process parameters, such as the radio frequency ranges and the powers for the RF1 206 and the RF2 208, the process temperature, the process pressure, and the gas flow rates are designed to effectively remove the oxide compounds in the layers 122 and 124 of the semiconductor device 100 and reduce the S/D contact resistance thereof. The process chamber 200 is coupled to a control module 210 for configuring and controlling the various components of the process chamber 200 (such as the e-chuck 202, the RF1 206, and the RF2 208).

In an embodiment, with the process chamber 200 configured as discussed above (e.g., having the disclosed gas flow rates, RF powers, e-chuck temperature, etc.), the operation 20 effectively removes the oxide compounds from the layers 122 and 124 when performed for a duration of 85 seconds to 95 seconds, such as 90 seconds. If the duration is too short (e.g., less than 85 seconds), some areas of the structure (such as the lower edge of the sidewall surfaces 108-S) may not be adequately cleaned. A duration longer than 95 seconds is permissible but may not be needed. For purposes of wafer volume production, a shorter duration in the operation 20 is generally desired. In various embodiment, the operation 20 reduces the level of oxygen in the layers 122 and 124 to an undetectable level when performed for the disclosed duration of 85 seconds to 95 seconds.

Figure 6:
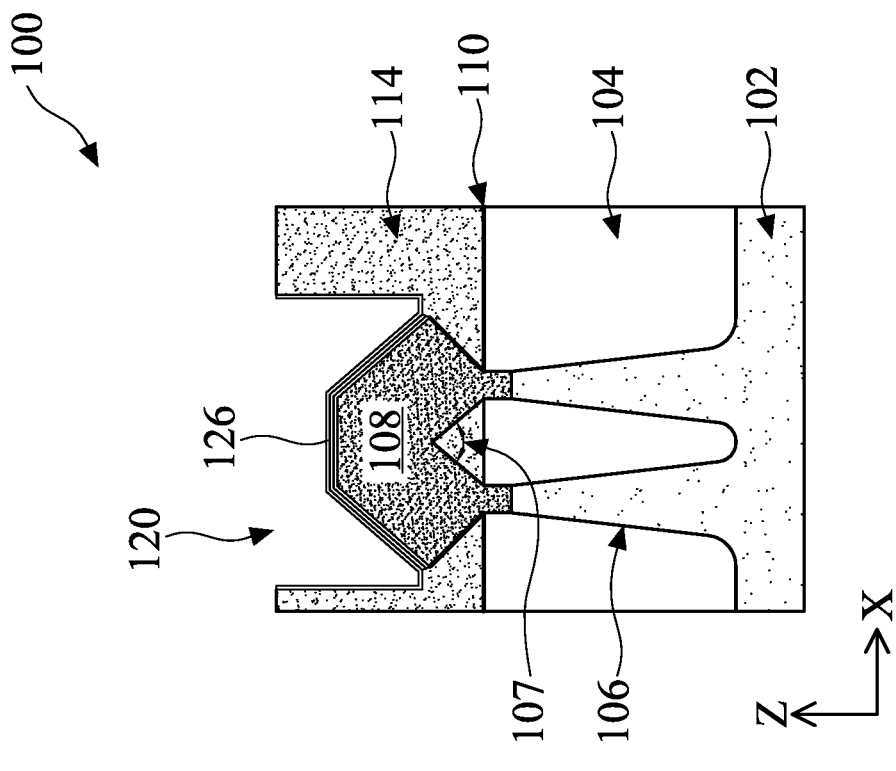

Referring to FIG. 1, at operation 22, the method 10 deposits another conductive barrier layer 126 in the contact hole 120. In the present embodiment, the operation 22 uses an atomic layer deposition (ALD) technique (such as a plasma enhanced ALD technique) to deposit the conductive barrier layer 126 such that the layer 126 is formed to have a substantially uniform thickness along the sidewalls and the bottom surface of the contact hole 120, such as shown in FIG. 6. As a result, the layer 126 fully covers the conductive barrier layer 124 at the bottom of the contact hole 120 as well as the dielectric sidewalls of the contact hole 120 (i.e., the sidewalls of the dielectric layer 114 exposed in the contact hole 120). The conductive barrier layer 126 serves to prevent subsequently deposited metal elements from diffusing into the dielectric layer 114. In an embodiment, the conductive barrier layer 126 includes a conductive nitride such as titanium nitride or tantalum nitride. In an embodiment, the conductive barrier layer 126 has a thickness of 0.6 nm to 1.9 nm such as about 1.2 nm. As stated above, if the conductive barrier 126 is too thick, it may adversely increase the S/D contact resistance. On the other hand, if the conductive barrier 126 is too thin, it may not effectively prevent metal diffusion.

Figure 7:
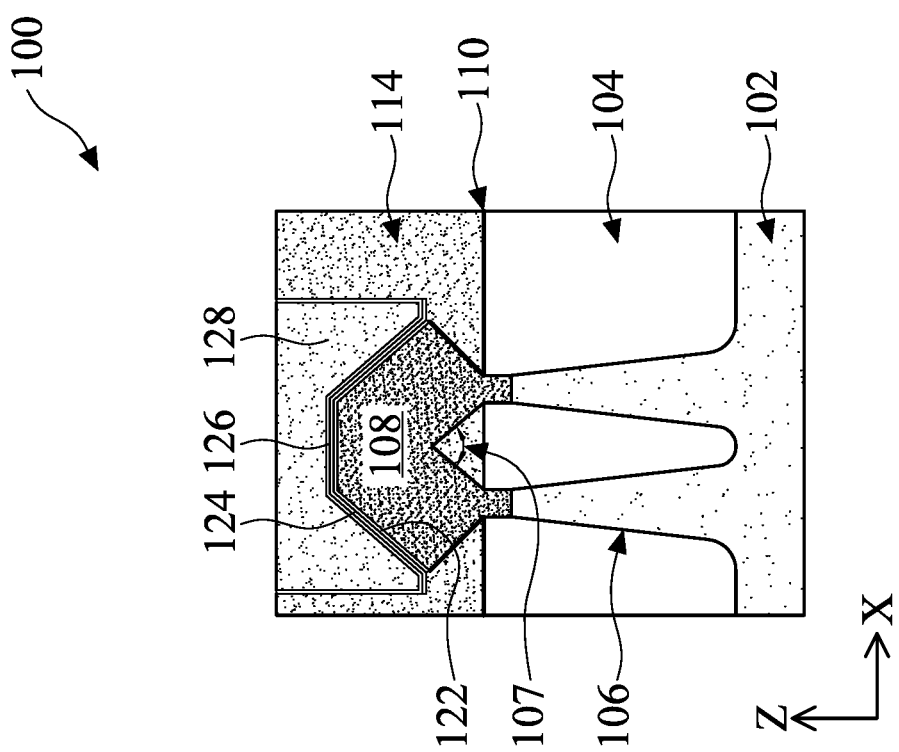

Referring to FIG. 1, at operation 24, the method 10 deposits one or more metal layers 128 into the contact hole 120, as shown in FIG. 7. For example, the metal layers 128 may include a metal seed layer deposited using physical vapor deposition (PVD) and/or chemical vapor deposition (CVD) followed by a bulk metal layer deposited using electroplating. The metal layers 128 may include aluminum (Al), tungsten (W), copper (Cu), cobalt (Co), combinations thereof, or other suitable material. The metal layers 128 are also referred to as the bulk metal contact.

Figure 8:
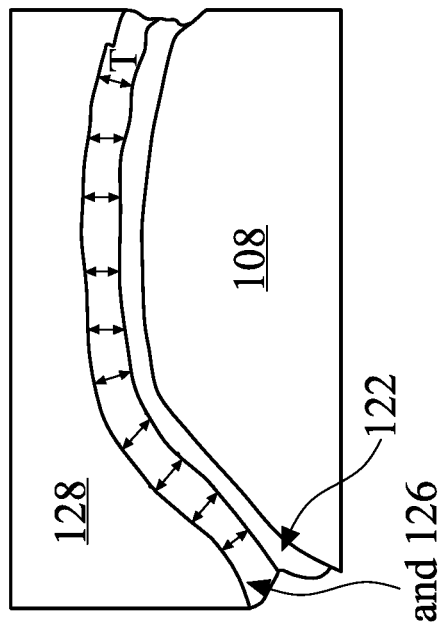
FIG. 8 illustrates a partial view of an interface between a source/drain and a contact thereon, in accordance with some embodiments of the present disclosure.

FIG. 8 shows a partial, schematic view of the semiconductor device 100, particularly illustrating the interface between the bulk metal contact 128 and the epitaxial feature 108. As illustrated, the interface includes the silicide layer 122 and the conductive barrier layers 124 and 126. The disclosed plasma cleaning process is able to substantially eliminate oxygen compounds in the interface, not only from the top surface of the epitaxial feature 108, but also from the side surfaces of the epitaxial feature 108. As an added benefit, the conductive barrier layers 124 and 126 can be made thinner than in processes that do not use the disclosed plasma cleaning process. In an embodiment, both the conductive barrier layers 124 and 126 include titanium nitride and an average thickness of the two layers is about 3.0 nm or thinner. The average thickness is calculated by measuring the thickness, T, of the two layers along the top and the side surfaces of the epitaxial feature 108. In an embodiment, the average thickness is about 2.6 nm when the plasma cleaning process is applied for about 85 to 95 seconds with a ratio of the $N_2$ gas flow rate to the $H_2$ gas flow rate in the range of 0.22 to 0.26, and the RF1 206 supplying about 70 to 80 W power. In another embodiment, the average thickness is about 2.3 nm when the plasma cleaning process is applied for about 85 to 95 seconds with a ratio of the $N_2$ gas flow rate to the $H_2$ gas flow rate of 0.22 to 0.26, and the RF1 206 supplying about 45 to 55 W power.

Referring to FIG. 1, at operation 26, the method 10 performs further processes to the semiconductor device 100. For example, the operation 26 may perform a chemical mechanical planarization (CMP) process to remove any excessive portions of the layers 128 and 126 outside the contact hole 120. For example, the operation 26 may deposit dielectric layers over the layers 114, 126, and 128, and form metal lines and metal vias in those dielectric layers to form multilevel interconnect structure.

FIGS. 10, 11, and 12 show the signal intensity (e.g., as a count of atoms) curves of certain chemical elements in certain layers of experimental samples, obtained from SIMS (secondary ion mass spectrometry) measurements. Each of the experimental samples includes a layer of silicon dioxide ($SiO_2$), a layer of titanium nitride (TiN) over the $SiO_2$ layer, and a layer of cobalt (Co) over the TiN layers. The layer of TiN is deposited similar to how the layer 124 is deposited and is subjected to the plasma cleaning process of the present disclosure. These samples closely resemble the S/D contact structure of the semiconductor device 100, except replacing the epitaxial feature 108 and the silicide layer 122 with the $SiO_2$ layer. Therefore, measurements from these samples closely reflect the results of the disclosed process of making the semiconductor device 100. Referring to FIG. 10, shown therein are the signal intensity curves of oxygen across the layers. Particularly, the curve 302 reflects the oxygen intensity when no oxygen at all is introduced during the deposition of the TiN layer. However, this is difficult to achieve in a practical production process. The curve 304 reflects the oxygen intensity when no plasma cleaning process is applied to the TiN layer. The curve 306 reflects the oxygen intensity when the disclosed plasma cleaning process is applied. Particularly, the curve 306 reflects the oxygen intensity when the disclosed plasma cleaning process is applied at about 380° C. to 400° C. with a ratio of the $N_2$ gas flow rate to the $H_2$ gas flow rate of about 0.22 to 0.26. As shown in FIG. 10, the oxygen signal intensity is dramatically reduced (for example, by 38% to 55%) by using the disclosed plasma cleaning process compared with the process that does not use the disclosed plasma cleaning process. Referring to FIG. 11, shown therein are the signal intensity curves of titanium nitride across the layers, under the same process conditions as in FIG. 10. The curve 308 corresponds to the condition when no oxygen at all is introduced during the deposition of the TiN layers. The curve 309 corresponds to the condition when the disclosed plasma cleaning process is applied. Aside from the curve 308, the titanium nitride signal intensity is about the same among the different samples. Referring to FIG. 12, shown therein are the signal intensity curves of carbon across the layers, under the same process conditions as in FIG. 10. The curve 310 corresponds to the condition when no oxygen at all is introduced during the deposition of the TiN layer. The curve 312 corresponds to the condition when no plasma cleaning process is applied to the TiN layer. The curve 314 corresponds to the same process condition as the curve 306. As shown in FIG. 12, the carbon signal intensity is dramatically reduced (e.g., by 10 to 1000 times) by using the disclosed plasma cleaning process compared with the process that does not use the plasma cleaning process.

In various embodiments, as a result of the disclosed plasma cleaning process, the atomic ratio of the oxygen to the metal nitride (e.g., TiN) at the interface between the layers 128 and 126 in the semiconductor device 100 (corresponding to the boundary between the Co layer and the TiN layer in the samples) is measured to be about 1.0 or lower, such as in a range of about 0.15 to about 1.0. This can be calculated using the curves in FIGS. 10 and 11. The same ratio measured on samples fabricated without using the disclosed plasma cleaning process is found to be above 1.0. The lower ratio indicates a lower oxygen content in the S/D contact structure and a lower S/D contact resistance.

Figure 13:
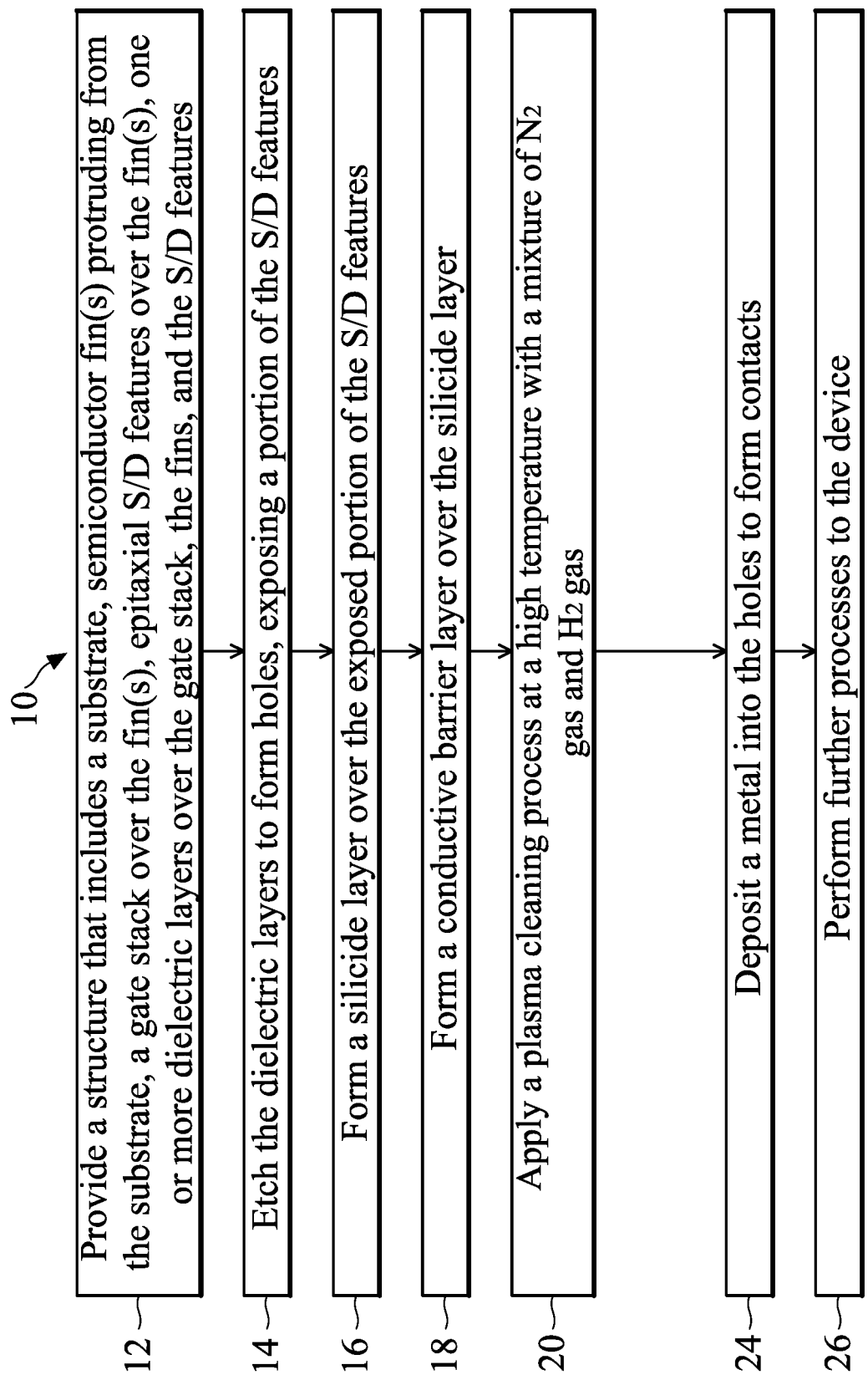
FIG. 13 shows a flow chart of a method of forming a semiconductor device with reduced source/drain contact resistance, according to another embodiment of the present disclosure.
Figure 15:
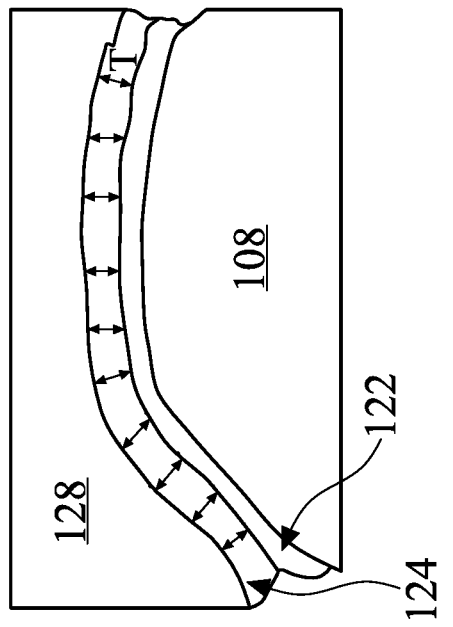
FIG. 15 illustrates a partial view of an interface between a source/drain and a contact thereon, in accordance with some embodiments of the present disclosure.
Figure 14:
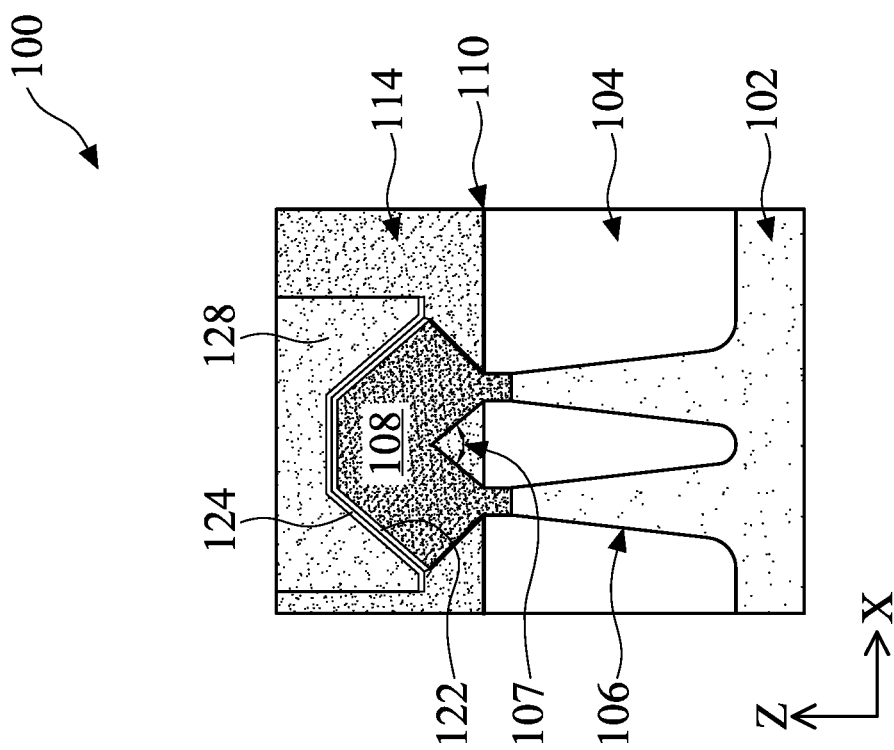
FIG. 14 illustrates a cross sectional view of forming a semiconductor device according to the method of FIG. 13, in accordance with some embodiments.

FIG. 13 shows a flow chart of the method 10, according to another embodiment of the present disclosure. This embodiment is the same as that shown in FIG. 1, but with the operation 22 omitted. In other words, in this embodiment, the method 10 does not deposit the conductive barrier layer 126. The resultant structure of the device 100 is shown in FIG. 14, and the interface between the metal layer 128 and the source/drain 108 is illustrated in FIG. 15. As shown, the metal layer 128 is deposited directly on the conductive barrier layer 124. Other aspects of this embodiment are the same as discussed above with reference to FIG. 1 and are omitted for simplicity.

Figure 16:
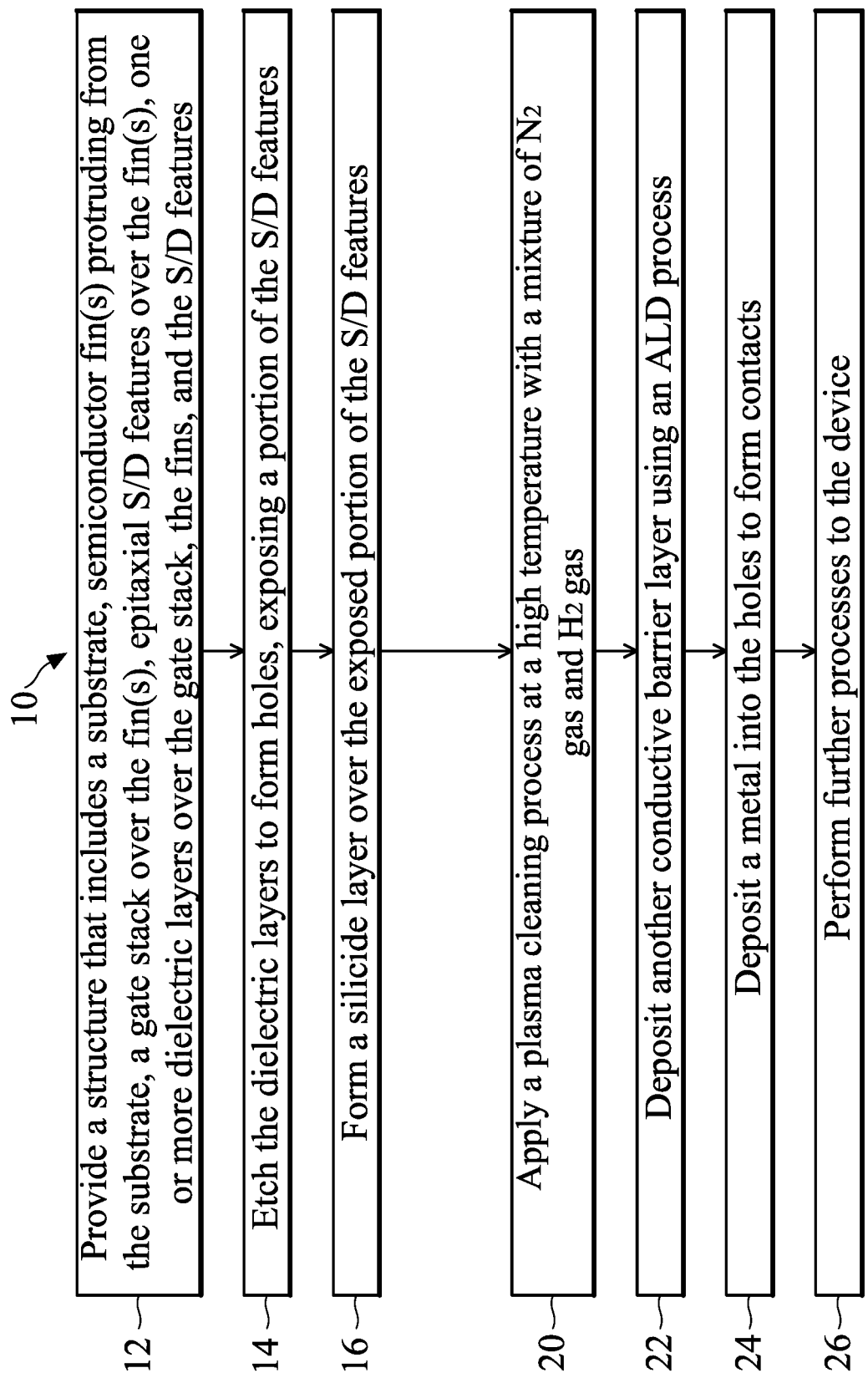
FIG. 16 shows a flow chart of a method of forming a semiconductor device with reduced source/drain contact resistance, according to some embodiments of the present disclosure.
Figure 18:
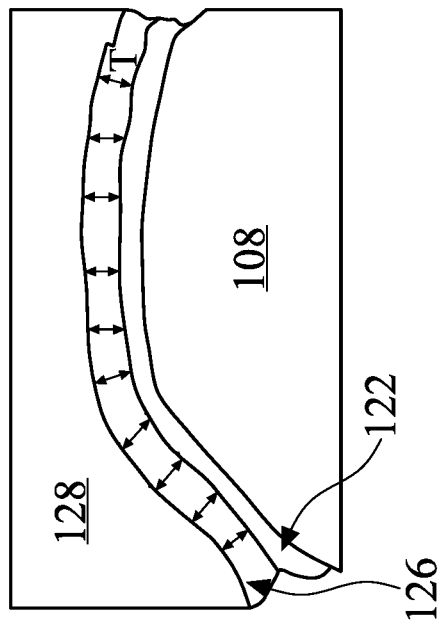
FIG. 18 illustrates a partial view of an interface between a source/drain and a contact thereon, in accordance with some embodiments of the present disclosure.
Figure 17:
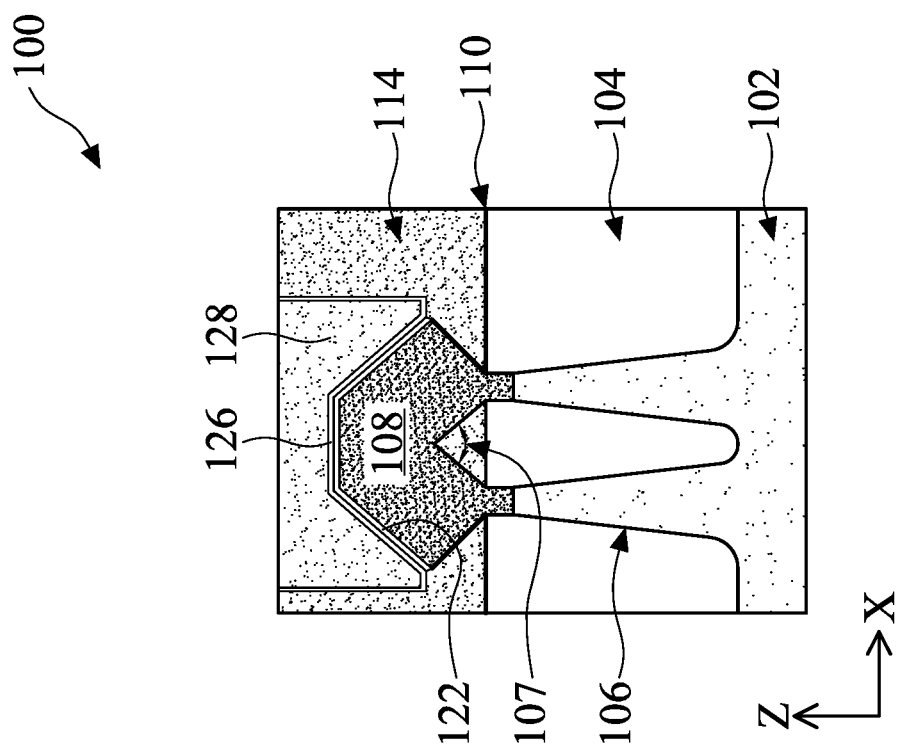
FIG. 17 illustrates a cross sectional view of forming a semiconductor device according to the method of FIG. 16, in accordance with some embodiments.

FIG. 16 shows a flow chart of the method 10, according to yet another embodiment of the present disclosure. This embodiment is the same as that shown in FIG. 1, but with the operation 18 omitted. In other words, in this embodiment, the method 10 does not deposit the conductive barrier layer 124, and the operation 20 is applied to remove the oxides from the silicide layer 122. Further, the silicide layer 122 may be formed using the operation 16 discussed with reference to FIG. 1 or by other methods such as by physical vapor deposition (PVD). The resultant structure of the device 100 is shown in FIG. 17, and the interface between the metal layer 128 and the source/drain 108 is illustrated in FIG. 18. As shown, the conductive barrier layer 126 is deposited directly on the silicide layer 122. Other aspects of this embodiment are the same as discussed above with reference to FIG. 1 and are omitted for simplicity.

Although not intended to be limiting, one or more embodiments of the present disclosure provide many benefits to a semiconductor device and the formation thereof. For example, an embodiment of the present disclosure applies a plasma cleaning process to clean a conductive barrier layer for S/D contacts. The plasma cleaning process can effectively remove oxides from the conductive barrier layer, thereby reducing the S/D contact resistance. Various embodiments of the present disclosure may be easily integrated into existing manufacturing processes.

In one example aspect, the present disclosure is directed to a method for fabricating a semiconductor device. The method includes providing a structure that includes a semiconductor substrate, an epitaxial source/drain feature over the semiconductor substrate, and one or more dielectric layers over the epitaxial source/drain feature; etching a hole into the one or more dielectric layer to expose a portion of the epitaxial source/drain feature; forming a silicide layer over the portion of the epitaxial source/drain feature; forming a conductive barrier layer over the silicide layer; and applying a plasma cleaning process to at least the conductive barrier layer, wherein the plasma cleaning process uses a gas mixture including $N_2$ gas and $H_2$ gas and is performed at a temperature that is at least 300° C.

In an embodiment of the method, a ratio of a flow rate of the $N_2$ gas to a flow rate of the $H_2$ gas is controlled to be in a range of 0.03 to 0.28 during at least a part of the plasma cleaning process. In another embodiment of the method, a ratio of a flow rate of the $N_2$ gas to a flow rate of the $H_2$ gas is controlled to be about 0.22 to 0.26 during the plasma cleaning process. In an embodiment of the method, the plasma cleaning process is performed at a temperature in a range from 300° C. to 500° C.

In an embodiment, the method further includes depositing a metal into the hole and over the conductive barrier layer. In a further embodiment, the method includes depositing a second conductive barrier layer over the conductive barrier layer before the depositing of the metal.

In an embodiment of the method, the plasma cleaning process is performed in a process chamber where the structure is held to an electrostatic chuck that is heated to about 380° C. to 400° C. In an embodiment of the method, the plasma cleaning process is performed for 85 seconds to 95 seconds.

In an embodiment of the method, the plasma cleaning process uses plasma that is generated at a radio frequency ranging from 1 MHz to 5 MHz. In a further embodiment, the plasma is directed to the structure at another radio frequency ranging from 10 MHz to 20 MHz during the plasma cleaning process.

In another example aspect, the present disclosure is directed to a method for fabricating a semiconductor device. The method includes providing a structure that includes a substrate, two semiconductor fins protruding from the substrate, a source/drain feature including silicon germanium over and connected to the two semiconductor fins, and one or more dielectric layers over the semiconductor fins and the source/drain feature; etching a hole into the one or more dielectric layer to expose a portion of the source/drain feature; forming one or more conductive layers over the portion of the source/drain feature, wherein the one or more conductive layers include titanium; performing a plasma cleaning process to the one or more conductive layers, wherein the plasma cleaning process uses plasma generated from a mixture having $N_2$ gas and $H_2$ gas and is performed at a temperature that is in a range from about 300° C. to about 400° C.; and after the plasma cleaning process is performed, depositing a metal layer into the hole.

In an embodiment of the method, the one or more conductive layers include a titanium nitride layer. In an embodiment of the method, a ratio of a flow rate of the $N_2$ gas to a flow rate of the $H_2$ gas is controlled to be in a range of 0.03 to 0.28 during at least a part of the plasma cleaning process while the flow rate of the $N_2$ gas is controlled to be 10 standard cubic centimeters per minute (sccm) or lower. In a further embodiment, the ratio is controlled to be about 0.22 to 0.26. In another further embodiment, the flow rate of the $N_2$ gas is controlled to be about 1 to 9 sccm.

In an embodiment of the method, the plasma cleaning process includes applying a radio frequency power to the plasma wherein the radio frequency power ranges from 50 W to 85 W.

In another example aspect, the present disclosure is directed to a semiconductor device. The semiconductor device includes a substrate, two semiconductor fins protruding from the substrate, an epitaxial feature over and connected to the two semiconductor fins, a silicide layer over the epitaxial feature, a barrier layer over the silicide layer, the barrier layer having a metal nitride, and a metal layer over the barrier layer. Along a boundary between the barrier layer and the metal layer, an atomic ratio of oxygen to metal nitride is about 0.15 to about 1.0.

In an embodiment of the semiconductor device, the ratio is about the same over a top surface of the epitaxial feature and over a sidewall of the epitaxial feature. In a further embodiment, the epitaxial feature includes silicon germanium (SiGe), the top surface of the epitaxial feature is in SiGe (001) plane, and the sidewall of the epitaxial feature is in SiGe (111) plane. In another embodiment of the semiconductor device, an average thickness of the barrier layer along the boundary is 3.0 nm or thinner.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
two semiconductor fins protruding from the substrate;
an epitaxial feature over the two semiconductor fins and connected to the two semiconductor fins;
a silicide layer over the epitaxial feature;
a barrier layer over the silicide layer, the barrier layer including a metal nitride; and
a metal layer over the barrier layer,
wherein along a boundary between the barrier layer and the metal layer, an atomic ratio of oxygen to metal nitride is about 0.15 to about 1.0.

2. The semiconductor device of claim 1, wherein the ratio is about the same over a top surface of the epitaxial feature and over a sidewall of the epitaxial feature.

3. The semiconductor device of claim 2, wherein the epitaxial feature includes silicon germanium (SiGe), the top surface of the epitaxial feature is in SiGe (001) plane, and the sidewall of the epitaxial feature is in SiGe (111) plane.

4. The semiconductor device of claim 1, wherein an average thickness of the barrier layer along the boundary is 3.0 nm or thinner.

5. The semiconductor device of claim 1, wherein the metal nitride includes titanium nitride.

6. The semiconductor device of claim 1, further comprising a dielectric layer surrounding the epitaxial feature, the silicide layer, the barrier layer, and the metal layer.

7. The semiconductor device of claim 6, wherein the barrier layer includes a first sublayer disposed on the silicide layer and substantially free from sidewalls of the dielectric layer and a second sublayer on the first sublayer and on the sidewalls of the dielectric layer.

8. The semiconductor device of claim 7, wherein the silicide layer and the first sublayer are substantially free of metal oxides.

9. A semiconductor device, comprising:
a substrate;
two semiconductor fins protruding from the substrate;
epitaxial features over each of the two semiconductor fins and merging into a merged epitaxial feature;
a silicide layer over top and sidewall surfaces of the merged epitaxial feature;
a first barrier layer over the silicide layer;
a second barrier layer over the first barrier layer, wherein each of the first and the second barrier layers includes a metal nitride;
a metal layer over the second barrier layer; and
a dielectric layer surrounding the merged epitaxial feature, the silicide layer, the first barrier layer, the second barrier layer, and the metal layer, wherein the first barrier layer is substantially free from sidewalls of the dielectric layer, and the second barrier layer is on the sidewalls of the dielectric layer.

10. The semiconductor device of claim 9, wherein the second barrier layer has a substantially uniform thickness.

11. The semiconductor device of claim 9, wherein the silicide layer and the first barrier layer are substantially free of oxygen.

12. The semiconductor device of claim 9, wherein an average thickness of the first and the second barrier layers is 3.0 nm or thinner as measured along the top and sidewall surfaces of the merged epitaxial feature.

13. The semiconductor device of claim 12, wherein the second barrier layer has a thickness in a range from 0.6 nm to 1.9 nm.

14. The semiconductor device of claim 9, wherein along a boundary between the second barrier layer and the metal layer, an atomic ratio of oxygen to metal nitride is about 0.15 to about 1.0.

15. The semiconductor device of claim 9, wherein the dielectric layer provides a hole, wherein the silicide layer, the first barrier layer, and the second barrier layer are disposed inside the hole, wherein the first barrier layer is also disposed on a bottom surface of the hole.

16. A semiconductor device, comprising:
a substrate;
two semiconductor fins protruding from the substrate;
an isolation structure over the substrate and isolating the two semiconductor fins from each other;
an epitaxial feature over and connected to the two semiconductor fins, the epitaxial feature having silicon germanium (SiGe);
a dielectric layer over the isolation structure and surrounding the epitaxial feature, wherein the dielectric layer provides a hole and surfaces of the epitaxial feature are within the hole;
a silicide layer inside the hole and over the surfaces of the epitaxial feature;
a first barrier layer inside the hole and over the silicide layer, wherein the first barrier layer includes a metal nitride and is substantially free from sidewalls of the hole;
a second barrier layer inside the hole and over the first barrier layer, wherein the second barrier layer is disposed on the sidewalls of the dielectric layer; and
a metal layer over the second barrier layer and at least partially inside the hole,
wherein along a boundary between the second barrier layer and the metal layer, an atomic ratio of oxygen to metal nitride is about 0.15 to about 1.0.

17. The semiconductor device of claim 16, wherein the surfaces of the epitaxial feature includes a top surface in SiGe (001) plane and a sidewall surface in SiGe (111) plane.

18. The semiconductor device of claim 16, wherein the first barrier layer is also disposed on a bottom surface of the hole.

19. The semiconductor device of claim 16, wherein the silicide layer and the first barrier layer are substantially free of oxygen.

20. The semiconductor device of claim 16, wherein an average thickness of the first and the second barrier layers is 3.0 nm or thinner as measured along the surfaces of the epitaxial feature.

* * * * *